United States Patent
Nakajima

(10) Patent No.: US 9,418,887 B2
(45) Date of Patent: Aug. 16, 2016

(54) METHOD OF MANUFACTURING SEMICONDUCTOR DEVICE

(71) Applicant: KABUSHIKI KAISHA TOSHIBA, Tokyo (JP)

(72) Inventor: Yumi Nakajima, Yokkaichi Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 14/475,562

(22) Filed: Sep. 2, 2014

(65) Prior Publication Data

US 2015/0279727 A1 Oct. 1, 2015

(30) Foreign Application Priority Data

Mar. 31, 2014 (JP) .................. 2014-074501

(51) Int. Cl.
| | |
|---|---|
| *H01L 21/311* | (2006.01) |
| *H01L 21/768* | (2006.01) |
| *H01L 21/02* | (2006.01) |
| *H01L 21/033* | (2006.01) |

(52) U.S. Cl.
CPC ...... *H01L 21/76805* (2013.01); *H01L 21/0217* (2013.01); *H01L 21/02164* (2013.01); *H01L 21/02271* (2013.01); *H01L 21/0337* (2013.01); *H01L 21/31116* (2013.01); *H01L 21/31133* (2013.01); *H01L 21/31144* (2013.01)

(58) Field of Classification Search
CPC ................ H01L 21/76805; H01L 21/31116; H01L 21/31144; H01L 21/0217; H01L 21/02271; H01L 21/02164; H01L 21/31133
See application file for complete search history.

(56) References Cited

U.S. PATENT DOCUMENTS

| | | | | |
|---|---|---|---|---|
| 5,173,442 | A * | 12/1992 | Carey ............... | H01L 21/76811 257/E21.579 |
| 6,846,741 | B2 * | 1/2005 | Cooney, III ....... | H01L 21/76811 257/E21.579 |
| 6,911,397 | B2 | 6/2005 | Jun et al. | |
| 7,030,028 | B2 * | 4/2006 | Mori ................. | H01L 21/31138 257/E21.256 |
| 8,455,348 | B2 * | 6/2013 | Yonekura ........... | H01L 21/0332 438/626 |
| 8,759,177 | B2 * | 6/2014 | Yanai ................. | G11C 16/0408 257/E21.179 |
| 8,822,321 | B2 * | 9/2014 | Kajiwara .......... | H01L 27/11519 365/185.17 |
| 9,105,584 | B2 * | 8/2015 | Omura ............... | H01L 21/3088 |
| 9,224,744 | B1 * | 12/2015 | Yokota .............. | H01L 21/0338 |
| 2011/0175233 | A1 | 7/2011 | Ueki | |
| 2013/0248485 | A1 * | 9/2013 | Watanabe .......... | G11B 5/855 216/22 |
| 2015/0262873 | A1 * | 9/2015 | Chu .................. | H01L 21/76879 257/773 |
| 2015/0279727 | A1 * | 10/2015 | Nakajima ......... | H01L 21/76805 438/702 |

FOREIGN PATENT DOCUMENTS

JP 2005-150493 6/2005

* cited by examiner

*Primary Examiner* — Savitr Mulpuri
(74) *Attorney, Agent, or Firm* — Patterson & Sheridan, LLP

(57) ABSTRACT

According to one embodiment, a method of manufacturing a semiconductor device is provided. The method includes forming a first insulating film, forming a first mask extending in first direction on the first insulating film, etching the first insulating film using the first mask, resulting in trenches extending in a first direction, forming a second mask on the trenches and the first mask, etching the first insulating film using the second mask and the first mask to form contact openings extending from the trenches.

12 Claims, 8 Drawing Sheets

METHOD OF MANUFACTURING SEMICONDUCTOR DEVICE

CROSS-REFERENCE TO RELATED APPLICATION

This application is based upon and claims the benefit of priority from Japanese Patent Application No. 2014-074501, filed Mar. 31, 2014, the entire contents of which are incorporated herein by reference.

FIELD

Embodiments described herein relate generally to a method of manufacturing a semiconductor device.

BACKGROUND

In recent years, the line width of circuit patterns formed in semiconductor devices has decreased with the miniaturization of memory device features. Memory devices have a multilayer wiring structure configured with a large number of wirings and wiring layers. The multilayer wiring is provided with a contact (via) that electrically connects an upper-layer wiring to a lower-layer wiring. By decreasing line widths, misalignment may occur between the upper-layer wirings and lower-layer wirings and a only partial overlap or complete lack of connection between the contact (via) and one or both of the upper lines and lower lines may occur as a result of the misalignment of the contact opening which is then filled with a conductor, with the upper and lower wiring layer locations.

DESCRIPTION OF THE DRAWINGS

FIG. 6(*b*) is a cross-sectional view taken along line Ia-Ia of FIG. 6(*a*) showing the result of a step of a method of manufacturing a semiconductor device of FIG. 6(*a*).

FIG. 7(*b*) is a cross-sectional view taken along line Ia-Ia of FIG. 7(*a*) showing the result of a step of a method of manufacturing a semiconductor device.

DETAILED DESCRIPTION

Figure 1:
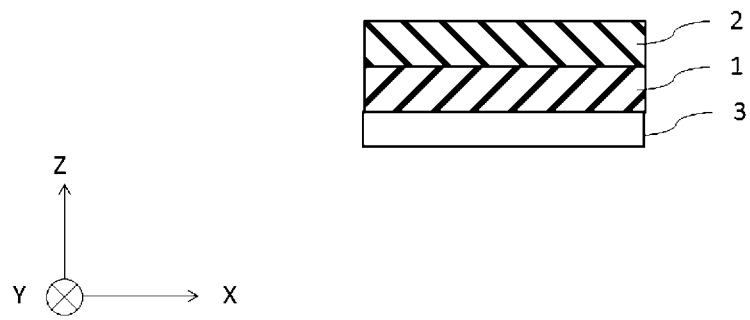
FIG. 1 is a diagram illustrating a result of a step of a method of manufacturing a semiconductor device according to a first embodiment.

An exemplary embodiment provides a manufacturing method for improving the positioning between a contact opening and a wiring trench while maintaining a desired contact trench shape.

In general, according to one embodiment, a method of manufacturing a semiconductor device includes forming a first insulating film, forming a first mask 8 extending depthwise on the first insulating film, etching the first insulating film 1 using the first mask 8, resulting in trenches 10 extending in a y-direction of the first insulating film at a first depth less than the full depth into the first insulating film, forming a second mask 9 on the trenches 10 and the first mask 8, and etching into the first insulating film 1 using the second mask 9 and the first mask 8 to form one or more contact trenches 11 extending through the first insulating film.

Hereinafter, exemplary embodiments will be described with reference to the accompanying drawings.

(First Embodiment)

A method of manufacturing a semiconductor device according to a first embodiment will be described with reference to FIGS. 1 to 10C. The direction which is parallel to the base layer 3 is assumed to be the X direction (second direction) in FIG. 2. The direction which is orthogonal depth to the X direction is assumed to be Y direction (first direction) in FIG. 2. The direction extending through the base layer 3 to the third insulating film 5 is assumed to be Z direction in FIG. 2.

As illustrated in FIG. 1, a to-be-processed film 2 is formed on a first insulating film 1 by, for example, a chemical vapor deposition (CVD) method. The to-be-processed film 2 is, for example, a silicon-based film. A base layer 3 having a lower-layer wiring and the like formed therein is provided on a surface of the first insulating film 1 on the opposite side thereof to a surface on which the to-be-processed film 2 is formed.

Figure 2:
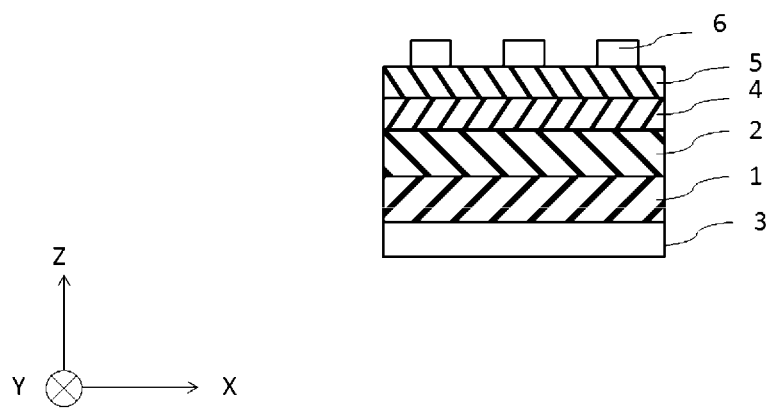
FIG. 2 is a diagram illustrating a result of a step of a method of manufacturing a semiconductor device according to the first embodiment.

As illustrated in FIG. 2, a second insulating film 4 and a third insulating film 5 are applied onto the to-be-processed film 2 by, for example, spin coating. The second insulating film 4 is, for example, a resist film including carbon (C), and the third insulating film 5 is, for example, a silicon oxide film.

Figure 3:
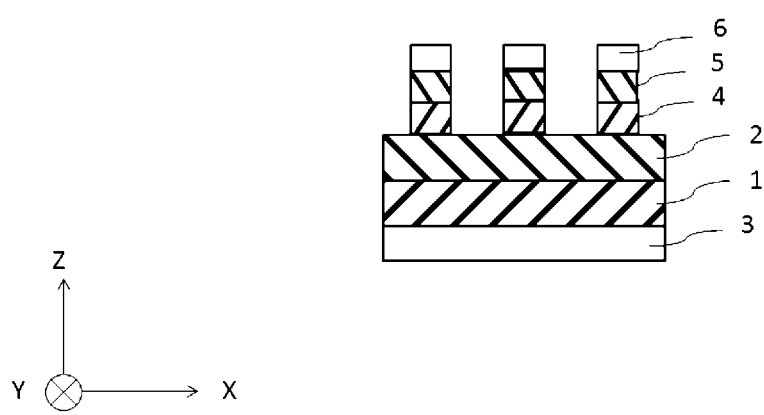
FIG. 3 is a diagram illustrating a result of a step of a method of manufacturing a semiconductor device according to the first embodiment.

Next, a photoresist is applied onto the third insulating film 5. A wiring shaped pattern extending in the Y direction is formed by exposure and developing of the photoresist. The wiring-shaped pattern is thus formed as a third mask 6 on third insulating film 5. As illustrated in FIG. 3, the third insulating film 5 is processed into a wiring pattern shape extending in the Y direction based on the pattern of openings of the third mask 6 by, for example, reactive ion etching (RIE). Further, the second insulating film 4 is processed into a wiring pattern shape extending in the Y direction by RIE, using the third insulating film 5 as a mask.

Figure 4:
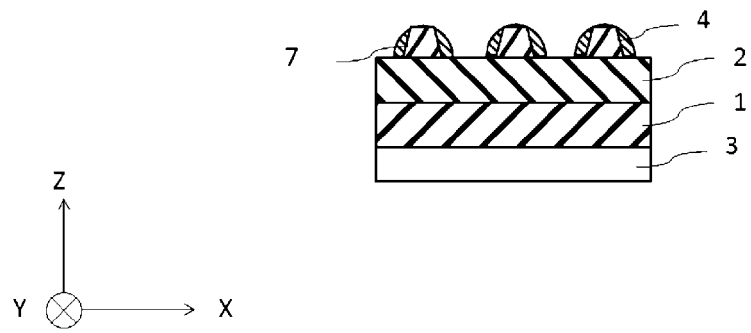
FIG. 4 is a diagram illustrating a result of a step of a method of manufacturing a semiconductor device according to the first embodiment.

As illustrated in FIG. 4, both lateral sides of the second insulating film 4 are exposed to, for example, a flowing hydrofluoric acid (HF) treatment. Thus, the width of the upper portion of the second insulating film 4 in the X direction is narrower than the width of the lower portion of the second insulating film 4, i.e., a tapered profile narrowing toward the exposed portion of the line formed in the second insulating film 4 is formed. Next, a spacer film 7 is covered with the second insulating film 4 by, for example, a CVD method. The spacer film 7 is, for example, a silicon nitride (SiN) which selectively forms on the surfaces of the remaining insulating film 4. Thereafter, the spacer film 7 is planarized by, for example, RIE. Thus, the second insulating film 4 remains interposed between the spacer films 7.

Figure 5:
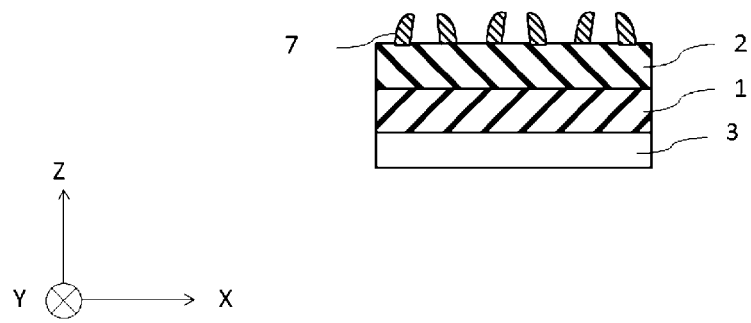
FIG. 5 is a diagram illustrating a result of a step of a method of manufacturing a semiconductor device according to the first embodiment.

As illustrated in FIG. 5, the second insulating film 4 interposed between the spacer films 7 is removed by selective etching thereof. The to-be-processed film 2 is thus exposed to openings having the width of the lower portion side of the second insulating film 4 in the X direction between the adjacent spacer films 7 from which the second insulating film 4 was removed, and in locations between adjacent spacer films where the second insulating film was removed before forming the spacer films.

The exposed to-be-processed film 2 is then etched by, for example, RIE, using the spacer film 7 as a mask to form a trench pattern therein as illustrated FIGS. 6A and 6B. The to-be-processed film 2 remaining without being etched thus forms a patterned hard mask 8 as a mask (first mask) having a plurality of stripes or lines extending in the Y direction having gaps therebetween where the underlying first insulating film 1 is exposed. The hard mask 8 stripes are spaced in the X direction at predetermined intervals based on the spacing of the openings in the mask formed by the spacer film 7. It is possible to more finely process the hard mask stripes 8 using the spacer film 7 as a mask, i.e., to form a mask stripe 8 smaller in the x direction and having better defined features than that of the second insulating film 4, as opposed to forming the hard mask stripes 8 using a resist pattern as a mask. From this, the first insulating film 1 is exposed in portions where the stripes of the hard mask 8 are not provided.

As illustrated in FIGS. 7A and 7B, the first insulating film 1 is etched by, for example, RIE to transfer the opening pattern of the hard mask 8 therein. Thus, the first insulating film 1 is processed into a plurality of trenches 10 extending in the Y direction into, but not through, the first insulating film 1.

Figure 8A:
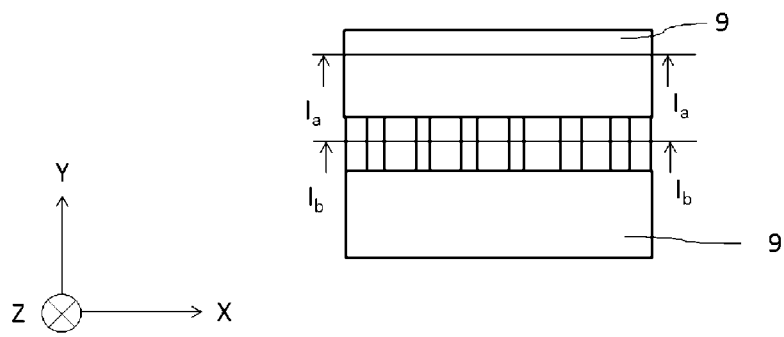
FIG. 8A is a plan view showing the result of a step of a method of manufacturing a semiconductor device according to the first embodiment.
Figure 8B:
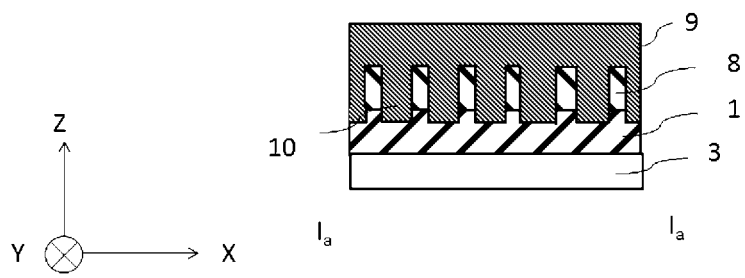
FIG. 8B is a cross-sectional view taken along line Ia-Ia of FIG. 8A showing the result of a step of a method of manufacturing a semiconductor device.
Figure 8C:
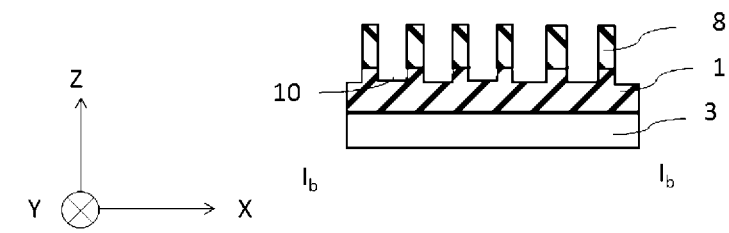
FIG. 8C is a cross-sectional view taken along line Ib-Ib of FIG. 8A showing the result of a step of a method of manufacturing a semiconductor device.

A resist film is formed on the trenches 10 and the remaining hard mask 8. Thereafter, the resist film is processed into a second mask 9 by a lithographic (exposing and developing) technique. The second mask 9 is covered with the trenches 10 and the lines of the hard mask 8. Then, the second mask 9 is patterned into a pattern of openings in which the trenches 10 and the hard mask 8 are exposed through openings extending in the X direction. FIG. 8A shows a plurality of stripes of the hard mask 8 and trenches 10 therebetween exposed in an opening in a region of the second mask 9. In FIG. 8B the second mask 9 extending over and into the pattern of the hard mask 8 and trenches 10 along section Ia-Ia is shown. FIG. 8C shows the hard mask 8 and trenches 10 not covered by the second mask 9 along section Ib-Ib, where it has been removed. The openings in the second mask 9 may be formed such that the same trenches 10 and stripes of the hard mask 8 may be exposed at one or multiple locations, such that an opening in the second mask extends across one or more stripes of the hard mask 8 or trenches 10, or a combination of both types of openings may be formed.

Figure 9A:
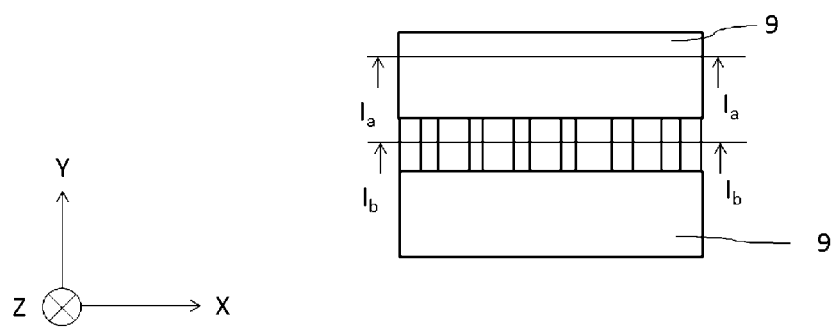
FIG. 9A is a plan view showing the result of a step of a method of manufacturing a semiconductor device according to the first embodiment.
Figure 9B:
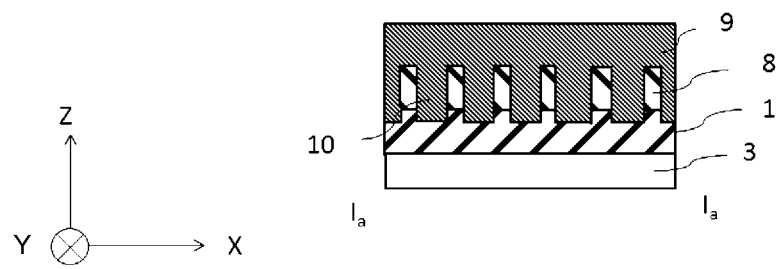
FIG. 9B is a cross-sectional view taken along line Ia-Ia of FIG. 9A showing result of a step of a method of manufacturing a semiconductor device.
Figure 9C:
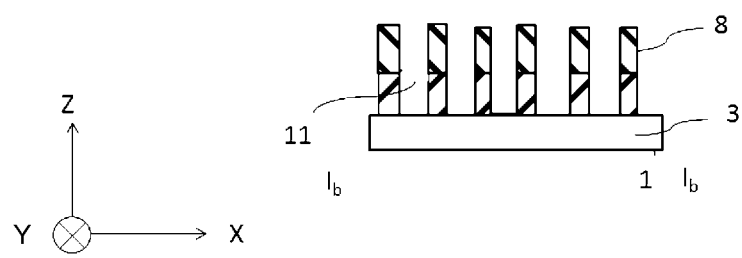
FIG. 9C is a cross-sectional view taken along line Ib-Ib of FIG. 9A showing the result of a step of a method of manufacturing a semiconductor device.

As illustrated in FIGS. 9A to 9C, for example, RIE is performed on the trenches 10 exposed between the stripes of the hard mask 8 only in the portion thereof exposed by the openings in the second mask 9. In FIG. 9B, where the second mask 9 covers both the hard mask 8 and trenches 10, no deeper etching occurs. In FIG. 9C, where the second mask 9 openings exposes the hard mask 8 and trenches 10, that portion of those trenches 10 further etched, using the sides of the stripes of the hard mask 8 as a self-aligned sidewall mask for extending those trenches 10 into contact openings extending fully through the first insulating layer 1. Thus, the etched portions of the trenches 10 where contact openings are formed are etched to be deeper than others of the trenches 10. The trenches which are deeper than the other trenches 10 thus form contact openings 11. The contact opening 11 is formed from a top surface on which the hard mask 8 on the first insulating film 1 is provided and extending to the base layer 3 provided with a lower-layer wiring (not illustrated), as compared to the shallower trenches 10 which are not further etched into the first insulating layer 1. A contact formed in contact openings electrically connects an upper-layer wiring and a lower-layer wiring to each other in a multilayer wiring.

Figure 10A:
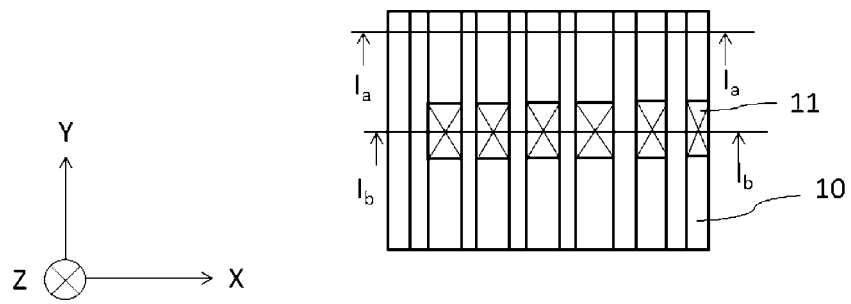
FIG. 10A is a plan view showing the result of a step of a method of manufacturing a semiconductor device according to the first embodiment, wherein a wiring trench structure and a contact self aligned therewith are formed.
Figure 10B:
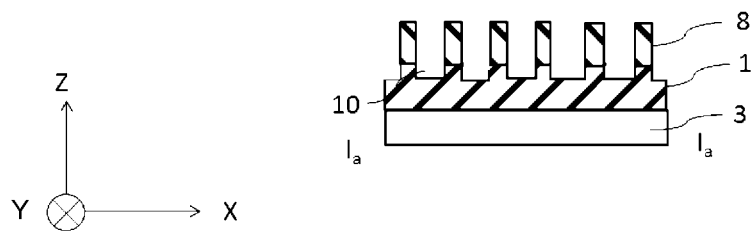
FIG. 10B is a cross-sectional view taken along line Ia-Ia of FIG. 10A showing the wiring trenches of the semiconductor device.
Figure 10C:
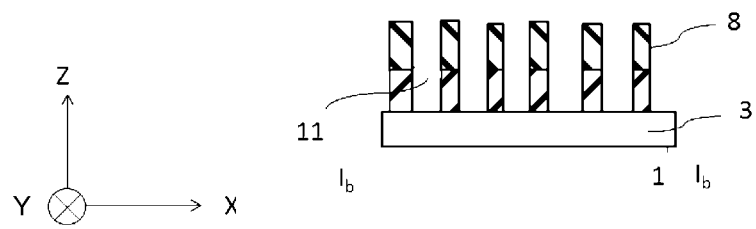
FIG. 10C is a cross-sectional view taken along line Ib-Ib of FIG. 10A showing the contact openings of the semiconductor device.

As illustrated in FIGS. 10A to 10C, the contact openings 11 and the trenches 10 are provided in the first insulating film 1 by the localized selective removal of the second mask 9 between the stripes of the hard mask 8 where the second mask 9 exposes the hard mask 8 and trenches 10. Although not illustrated in the drawing, a barrier metal and a conductive film are formed in the contact trench 11 and the trench 10. As a result of this process, a dual damascene wiring for electrically connecting the upper-layer wiring to the lower-layer wiring (not illustrated) is formed.

As described above, in the manufacturing method described in this embodiment, the contact trench 11 is formed at the position where the direction of the opening in the second mask 9 and direction of the wiring trench 10 overlap and cross each other. From this, the contact trench 11 having a width which is the same as the width of the wiring trench 10 in the X direction is formed, and thus misalignment in a connection location between the wiring and the contact does not occur. Accordingly, the contact area between the wiring layer formed in the wiring trench 10 and the contact extending to the underlying wiring layer in the contact opening 11 is increased and ensured, and thus it is possible to reduce contact resistance.

In the manufacturing method of this embodiment, the first insulating film 1 is processed into the trench 10 pattern 10 based on the width of the openings or gaps between the stripes of the hard mask 8. Thereafter, portions of the trenches 10 extending in a direction intersecting the direction of the opening(s) in the second mask 9 is etched to form the contact openings(s) 11, which are deeper than the trench 10, using opposed sidewalls in the opening of the second mask 9 to establish the Y direction width of the openings 11, and the spacing of the distance between the stripes of the hard mask 8 (and the underlying trench 10) as the opening width of the openings 11 in the X-direction. As a result, where the trench 10 and the contact opening 11 meet, they will have a continuously formed sidewall based on a continued etch of the sidewall of the trench 10 underlying the stripes of the hard mask 8. The previously formed shallow trench 10 may result in a reduction in damage of the bottom surface of the contact trench 11, which is connected to the upper portion side of the lower-layer wiring, due to RIE and the like. For this reason, the contact in which the conductive film is formed in the contact trench 11 may suppress the occurrence of disconnection and the like in the connection with the lower-layer wiring. In addition, it is possible to decrease a resistance value of the wiring including the upper-layer wiring, the lower-layer wiring, and the contact.

Modification Example of First Embodiment

Figure 11A:
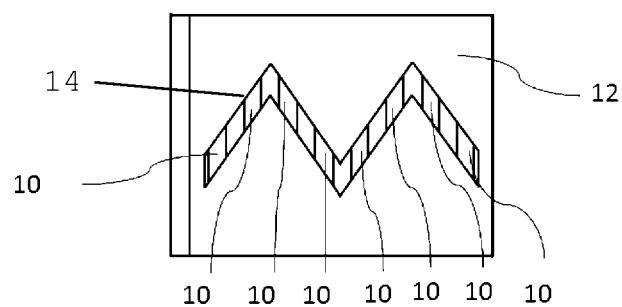
FIGS. 11A and 11B are plan views showing the result of a step of a method of manufacturing a semiconductor device according to modification of the first embodiment, showing a mask layer having diagonal openings therethrough extending to the trenches 10 and hard mask 8.
Figure 11B:
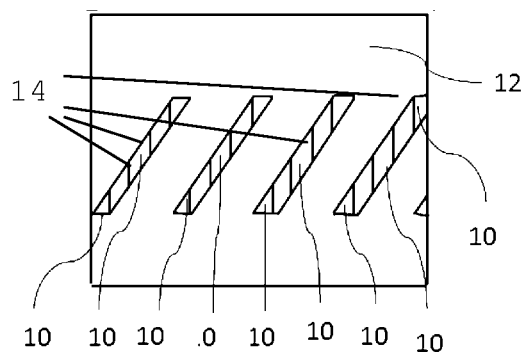
Figure 12A:
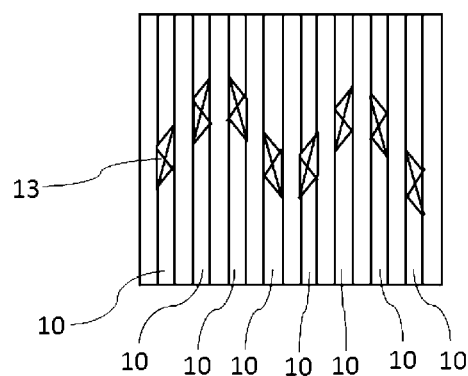
FIGS. 12A and 12B are plan views showing the semiconductor device according to modification of the first embodiment having wiring layers and self aligned, offset contact openings, formed therein.
Figure 12B:
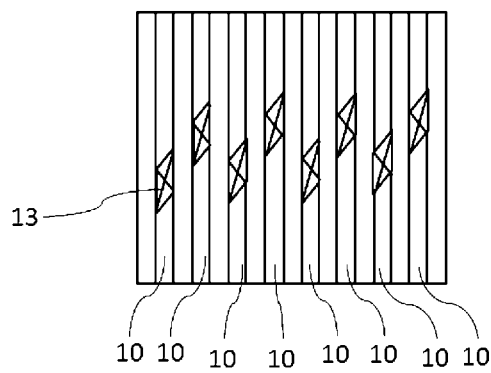

A method of manufacturing a semiconductor device according to a modification example of the first embodiment will be described below with reference to FIGS. 11A and 11B. FIGS. 11A, 11B, 12A, and 12B are plan views showing the semiconductor device according to the modification example of the first embodiment.

The modification example of the first embodiment is different from the first embodiment in that the mask opening pattern of a second mask 9 is different.

Since the modification example is the same as the first embodiment except for a difference in the mask opening pattern of the second mask 9, the same components are denoted by the same reference numerals, and the detailed description thereof will be omitted.

A method of manufacturing a semiconductor device according to the modification example of the first embodiment will be described below.

Figure 6:
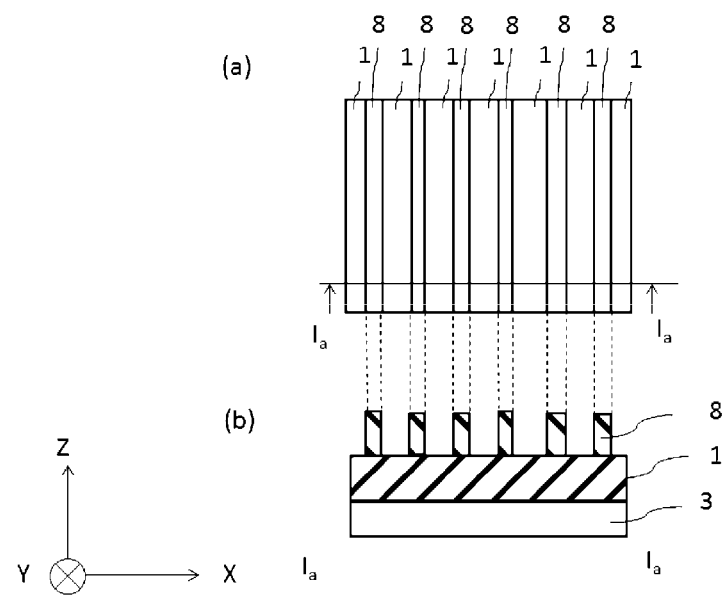
FIG. 6(*a*) is a plan view showing the result of a step of a method of manufacturing a semiconductor device according to the first embodiment.
Figure 7:
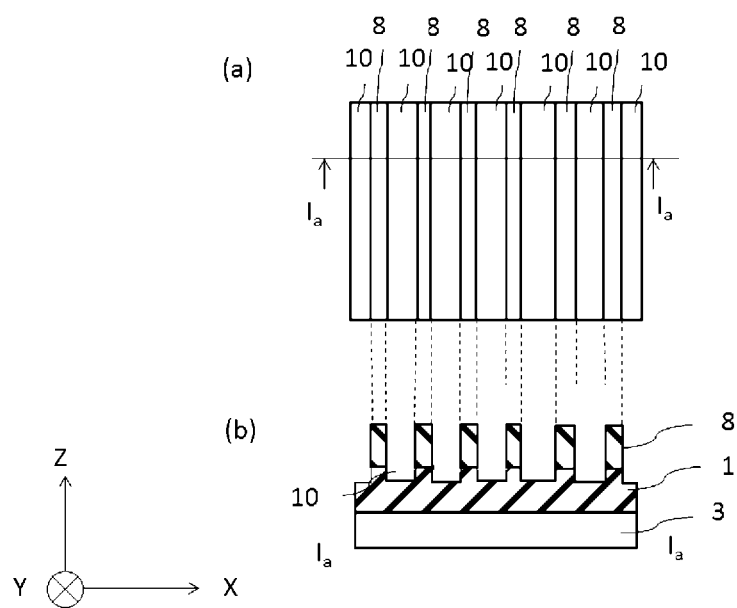
FIG. 7(*a*) is a plan view showing the result of a step of a method of manufacturing a semiconductor device according to the first embodiment.

A hard mask 8 of a stripe pattern is formed on a first insulating film 1 as shown in FIG. 6, and for example, RIE is performed on the first insulating film 1 based on the opening pattern in the stripes of hard mask 8, thereby forming trenches 10 as is shown in FIG. 7. Thereafter, a resist film is formed on the trenches 10 and the stripes of the hard mask 8. The resist film is processed into a third mask 12 having openings extending therethrough to the hard mask 8 stripes and/or the trenches 10 by a lithographic technique.

The third mask 12 openings 14 extend diagonally, i.e., in both the x and the y directions, through the third mask 12. Where the diagonally extending openings 14 overlie a trench 10, and an anisotropic etch process such as RIE is performed, a contact is formed in a parallelogram type pattern, where the sides of the contact opening extending in the X direction of FIG. 10A now also extend in the Y direction, i.e., along a diagonal to the X and Y directions, and the walls of the contact opening extending in the Y direction are unchanged from those of FIG. 10A and aligned with the sidewalls of the trench 10. In other words, the adjacent contact trenches 13 are shifted in the Y direction, and thus the trenches 10 are formed in a single (FIG. 12A) or double (FIG. 12B) staggered pattern.

As described above, in the manufacturing method described in the modification example of the first embodiment, the contact trench 11 having a width which is the same as that of the trench 10 is formed, and thus misalignment between the wiring layer in the wiring trench 10 and the wiring layer in the contact opening does not occur. Accordingly, a contact area between the wiring of the wiring in the trench 10 and the contact increases, and thus it is possible to reduce contact resistance of this junction. Further, the adjacent contact openings 13 spaced along the X direction are shifted in the Y direction, and thus it is possible to reduce parasitic capacitance between the adjacent contacts.

In addition, the previously formed shallow trench 10 may result in a reduction in damage of the bottom surface of the contact trench 11, which is connected to the upper portion side of the lower-layer wiring, due to RIE and the like. For this reason, the contact in which the conductive film is formed in the contact trench 11 may suppress the occurrence of disconnection and the like in the bonding surface with the lower-layer wiring.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    forming a first insulating film;
    forming a second insulating film on the first insulating film;
    forming a third insulating film on the second insulating film;
    etching the third insulating film to form features extending in a first direction;
    forming a spacer film on lateral sides of the etched features of the third insulating film;
    removing the third insulating film;
    etching the second insulating film not covered by the spacer film to form features extending in the first direction;
    performing a first etching of the first insulating film to form features extending in the first direction;
    forming a first mask having features at intervals along the first direction and extending in a second direction, crossing the first direction, on the first and second insulating films; and
    performing a second etching of the first insulating film using the first mask wherein
    the first etching removes portions of the first insulating film to a first depth into the first insulating film,
    the second etching removes portions of the first insulating film to a second depth into the first insulating film that is greater than the first depth,
    the first etching forms trenches in the first insulating film, the trenches having a bottom surface at the first depth and sidewalls extending along the first direction and spaced from each other in the second direction,
    the second etching extends the depth of some but not all portions of at least one trench formed by the first etching from the first depth to the second depth, and
    the second insulating film is used as a mask for patterning the first insulating film.

2. The method of claim 1, further comprising:
    exposing the lateral sides of the third insulating film to hydrofluoric acid (HF), wherein a width of an upper portion of the etched third insulating film is narrower than a width of a lower portion of the etched third insulating film.

3. The method of claim 1, wherein the spacer film is formed using a chemical vapor deposition (CVD) method.

4. The method of claim 1, wherein the spacer material is silicon nitride (SiN).

5. The method of claim 1, wherein the third insulating film is a resist film including carbon.

6. The method of claim 1, wherein the first insulating film is etched by reactive ion etching (RIE).

7. The method of claim 1, wherein the second etching forms a contact opening in the first insulating film.

8. The method of claim 1, wherein the third insulating film is etched using a second mask formed above the third insulating film and having features extending in the first direction.

9. The method of claim 1, further comprising:
forming a fourth insulating film on the third insulating film.

10. The method of claim 9, wherein the fourth insulating film is a silicon oxide film.

11. A method for manufacturing a semiconductor device, comprising:
providing a to-be-processed film on a first insulating film;
providing a second and third insulating film, on the to-be-processed film;
applying a photoresist material onto the third insulating film to form a wiring trench shaped pattern mask;
removing portions of the third insulating film using the wiring trench shaped pattern as a mask;
removing portion of the second insulating film using the third insulating film as a mask;
exposing the remaining second insulating film to an etchant;
covering the second insulating film with a spacer film;
removing the second insulating film;
etching exposed areas of the to-be-processed film not covered by the spacer film to form a first mask;
etching the first insulating film using the first mask to form a trench in a first direction;
forming a resist layer on the trench and the first mask;
forming a patterned second mask, wherein the second mask contacts the trench and the first mask; and
forming a contact opening by etching the trench where exposed by the pattern of the second mask and the first mask.

12. The method of claim 11, wherein a width of the contact opening equals a width of the trench in a second direction.

\* \* \* \* \*